United States Patent
Salem et al.

(10) Patent No.: US 10,393,849 B2
(45) Date of Patent: Aug. 27, 2019

(54) SYSTEMS AND METHODS FOR VERIFYING SUB METERING ACCURACY FOR ELECTRIC VEHICLE CHARGING STATIONS

(71) Applicant: San Diego Gas & Electric Company, San Diego, CA (US)

(72) Inventors: Khaled Salem, Pasadena, CA (US); Faridaddin Katiraei, Markham (CA); Amin Zamani, Mississauga (CA); Bahman Koosha, North York (CA)

(73) Assignee: San Diego Gas & Electric Company, San Diego, CA (US)

( * ) Notice: Subject to any disclaimer, the term of this patent is extended or adjusted under 35 U.S.C. 154(b) by 307 days.

(21) Appl. No.: 15/397,174

(22) Filed: Jan. 3, 2017

(65) Prior Publication Data

US 2018/0188346 A1   Jul. 5, 2018

(51) Int. Cl.
| | |
|---|---|
| *G01R 35/04* | (2006.01) |
| *G01R 22/06* | (2006.01) |
| *G06Q 30/04* | (2012.01) |
| *G06Q 50/06* | (2012.01) |
| *B60L 53/14* | (2019.01) |
| *B60L 53/31* | (2019.01) |
| *B60L 53/66* | (2019.01) |

(52) U.S. Cl.
CPC .......... *G01R 35/04* (2013.01); *B60L 53/14* (2019.02); *B60L 53/31* (2019.02); *B60L 53/665* (2019.02); *G01R 22/061* (2013.01); *G06Q 30/04* (2013.01); *G06Q 50/06* (2013.01)

(58) Field of Classification Search
CPC . G01R 31/40; G01R 31/006; G01R 19/16542
See application file for complete search history.

(56) References Cited

U.S. PATENT DOCUMENTS

| | | | | |
|---|---|---|---|---|
| 4,837,504 | A * | 6/1989 | Baer ..................... | G01R 21/133 324/116 |
| 8,830,039 | B1 * | 9/2014 | Egan ..................... | B60L 53/665 340/12.32 |
| 2009/0184689 | A1 * | 7/2009 | Kressner .............. | G01R 22/063 320/162 |
| 2012/0013301 | A1 * | 1/2012 | Gaul ......................... | B60L 3/12 320/109 |
| 2013/0127416 | A1 * | 5/2013 | Karner ................. | G06Q 20/102 320/109 |
| 2013/0154562 | A1 * | 6/2013 | Szostek .............. | B60L 11/1838 320/109 |

(Continued)

FOREIGN PATENT DOCUMENTS

CN    202330699    *   7/2012

*Primary Examiner* — Giovanni Astacio-Oquendo
*Assistant Examiner* — Alvaro E Fortich
(74) *Attorney, Agent, or Firm* — Sheppard Mullin Richter & Hampton LLP

(57) ABSTRACT

Some embodiments disclosed herein include systems and method for verifying meter accuracy. The system may include an electric vehicle charging station that includes a submeter that measures an amount of energy discharged from the electric vehicle charging station and to a connected electric vehicle. A meter test device may also be connected to the electric vehicle charging station to determine the accuracy of the submeter in local time.

18 Claims, 3 Drawing Sheets

(56) References Cited

U.S. PATENT DOCUMENTS

| | | | | |
|---|---|---|---|---|
| 2014/0055283 A1* | 2/2014 | Ching | ................ | H04Q 9/00 |
| | | | | 340/870.02 |
| 2015/0168465 A1* | 6/2015 | Gadiraju | ............ | H02J 13/0006 |
| | | | | 702/60 |
| 2015/0346288 A1* | 12/2015 | Hardy | ................ | G01R 21/133 |
| | | | | 702/58 |
| 2016/0161539 A1* | 6/2016 | Kraft | ................ | G01R 22/066 |
| | | | | 324/110 |
| 2016/0266594 A1* | 9/2016 | Kauffman | ............ | G06Q 50/06 |
| 2016/0327615 A1* | 11/2016 | Wallace | ............ | B60L 11/1809 |
| 2016/0370447 A1* | 12/2016 | Kim | ................ | G01R 22/10 |

\* cited by examiner

SYSTEMS AND METHODS FOR VERIFYING SUB METERING ACCURACY FOR ELECTRIC VEHICLE CHARGING STATIONS

TECHNICAL FIELD

The disclosed technology relates generally to utility submeters. More specifically, the disclosed technology relates to verifying the accuracy of utility submeters in real time for electric vehicle charging stations.

BACKGROUND

The monitoring of individual or specific uses electrical equipment is done so with utility submeters. As a result, submeters may then be used to determine a user's electrical bill based on its measurements indicating the amount of power consumed or discharged from the electrical equipment.

As such, submeters are installed in public electric vehicle charging stations to determine the billing amount for a client's use of the electric vehicle charging station. Because most public electric vehicle charging stations charge for the amount of energy consumed per each charge session, it is important that the submeters provide and display accurate measurements to reflect accurate billing information.

However, because there are no standardized or uniform public electric vehicle charging stations, there are various different submeters with their own specifications. Additionally, these public electric vehicle charging stations also have different calibration settings and configurations, making it very difficult to ensure the accuracy of these submeters. This is particularly troublesome considering that the National Institute of Standards and Technology has issued guidelines and accuracy requirements to ensure that the submeters are accurate and precise.

As a result, there currently is a need for a single universal meter test device that is able to capture measurements from a submeter in real time, and to compare measurements with a standard to calibrate and independently ensure the accuracy of these various submeters locally and in real time.

BRIEF SUMMARY OF EMBODIMENTS

According to various embodiments of the disclosed technology, a system for verifying accuracy of an electric meter is included. The system may include an electric vehicle charging station that includes a submeter to measure the amount of energy charged or discharged from the electric vehicle charging station. The system may also include a meter test device connected to the electric vehicle charging station to determine the accuracy of the measurements generated from the submeter.

Also included are methods for verifying accuracy of the electric meter. The methods many include connecting a meter test device to an electric vehicle charging station and connecting the meter test device to an electric vehicle. Then, the method may proceed with obtaining a first measurement from an electric meter installed within the electric vehicle charging station to determine the amount of energy locally discharged from the electric vehicle charging station. Next, a second measurement may be obtained with the meter test device to independently determine amount of energy locally discharged from the electric vehicle charging station to the electric vehicle. Measurements may obtain for a pre-determined charging duration or once pre-specified energy amount is delivered. Once the measurements are obtained, the method may proceed with comparing measurements from the electric meter test device (standard) to the electric meter to determine accuracy of the electric meter.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

The following description is not to be taken in a limiting sense, but is made merely for the purpose of describing the general principles of the disclosed embodiments. The present embodiments address the problems described in the background while also addressing other additional problems as will be seen from the following detailed description. Numerous specific details are set forth to provide a full understanding of various aspects of the subject disclosure. It will be apparent, however, to one ordinarily skilled in the art that various aspects of the subject disclosure may be practiced without some of these specific details. In other instances, well-known structures and techniques have not been shown in detail to avoid unnecessarily obscuring the subject disclosure.

Figure 1:
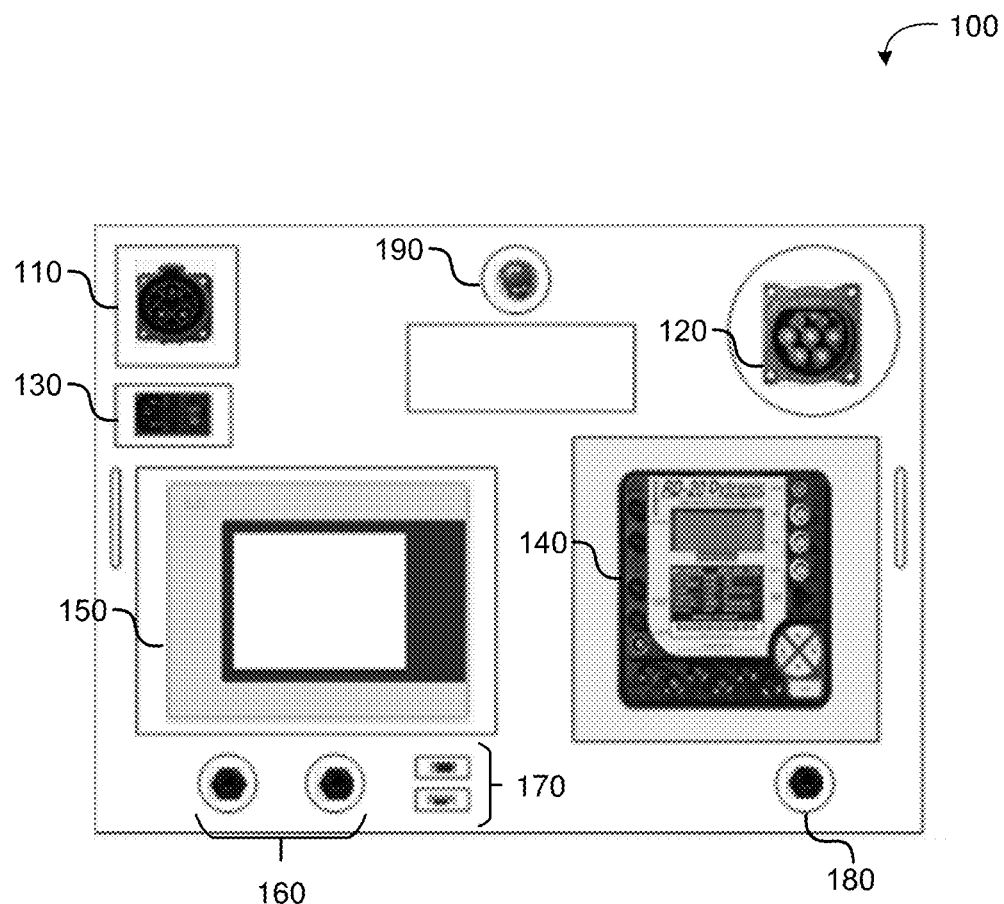
FIG. 1 illustrates a meter test device according to one particular embodiment.

FIG. 1 illustrates a meter test device 100 according to one particular embodiment. Here, the meter test device 100 may be used to validate the accuracy of submeters or electric revenue meters. In some embodiments, the meter test device 100 may be specifically used to validate the accuracy of the submeters in electric vehicle charging stations. However, it should be noted that the meter test device 100 is not strictly limited to ensuring the accuracy of the submeters in electric vehicle charging stations and rather, it can be used for various submeters or electric revenue meters used to monitor residences, businesses, and other electrically powered devices.

As illustrated, the figure depicts a meter test device 100 with an input socket 110 and an output socket 120. The input socket 110 may receive the corresponding plug that connects the electric vehicle charging station to the meter test device 100. Additionally, the output socket 120 may receive the corresponding plug that connects the meter test device 100 to an electrically powered device, such as an electric vehicle. When the meter test device 100 is connected to both the electric vehicle charging station and the electric vehicle via the input socket 110 and the output socket 120, the meter test device 100 may begin to measure the amount of electric energy that is being output to the electric vehicle.

To measure the amount of electric energy being output from the electric vehicle charging station to the electric vehicle, the meter test device 100 may include a meter test reader 140 that measures the incoming current from the electric vehicle charging station. With the current measurement, such measurements from the meter test reader 140 may be used as a reference measurement or standard for the field testing of submeters in electric vehicle charging stations. Thus, it is important and necessary that the meter test reader 140 is reliable and accurate. By way of example only, the meter test reader 140 may be a RD-20 dytronic reference standard device, which is known in the industry to be a highly accurate reference meter.

The meter test reader 140 may display voltage, current, power, and energy information. Once the information is displayed, a user is then able to compare the measurements from the meter test reader 140 with the measurements separately obtained and displayed on the submeter or revenue meters of the electric vehicle charging station. As such, the measurements from the meter test equipment 140 is treated as the standard reference.

Additionally, the meter test device 100 may further include a graphic user interface 150 that is attached to a system computer on the meter test device 100. The graphic user interface 150 may allow a user to input special control settings and commands for meter test device 100. By way of example, the meter test device may provide various options for selecting the type of meter accuracy test to be performed. For example, such tests may include a full-load test to determine the submeter accuracy at the full watt or kilowatt output rating of the electric vehicle charging station. Other tests may include a light-load test to determine the submeter accuracy for partial output rating of the watt or kilowatt rating of the electric vehicle charging station.

However, before any such measurements are obtained, the meter test device 100 may need to be configured to specific setting adjustments to ensure that the meter test device 100 is able to measure the incoming current from the electric vehicle charging station. This is particularly true considering that there are various different electric vehicle charging stations types and models that each has its own specifications, settings, and parameters. As a result, the meter test device 100 may need to adjust its settings in order to accommodate the type of electric vehicle charging station that is being monitored and measured.

As a result, the meter test device 100 may include a master library file that contains all the necessary and relevant equipment information of the target electric vehicle charging station. In some instances, the meter test device 100 may be configured or calibrated by having the user input the type or model information of the target electric vehicle charging station into the meter test device 100 via the graphic user interface 150. The graphic user interface 150 may be a touch screen panel. In other instances, the graphic user interface 150 may be an LCD panel with a keyboard attached to the meter test device 100. The onboard computer on the meter test device 100 may then automatically program itself to the necessary parameters so that the meter test device 100 is able to accurately detect the current and data measurements from the target electric vehicle charging station.

In other instances, the master library file may have the necessary information so that the user may look up the necessary information via the graphic user interface 150 to view the parameter and specification information of the target electric vehicle charging station. Once found, a user may then manually input the necessary setting information into the meter test device 100. As such, having the master library file programmed into the computer of the meter test device 100 allows for users to quickly and efficiently prepare and configure the meter test device 100.

Additionally, the master library file may also include general information about the target electric vehicle charging station that a user may find helpful as he or she is testing its meter or submeter. Such general information may include system update requirements, memory storage information, vendor information, etc. As such, the master library file may be continuously updated to reflect the most up to date information.

In some embodiments, the meter test device 100 may be programmed to perform other various tests to ensure meter accuracy. For example, some of the tests may include those to ensure that the general functions of the electric vehicle charging station are working properly. Such tests may include a power up test and a power interruption test to ensure that the electric vehicle charging station is properly able to power on and off. Additionally, other tests may include those that ensure that the proper measurements are being properly recognized and measured with the meter test device. Such tests may include a voltage variation test, a frequency variation test, and a harmonic test.

As further illustrated, the meter test device 100 may also include Ethernet ports 160 and serial interface ports 170. These ports may be used to connect the meter test device 100 with data terminal equipment and data communications equipment, such as computers, modems, printers, etc. Additionally, a communication port 180 may also be included.

Figure 2:
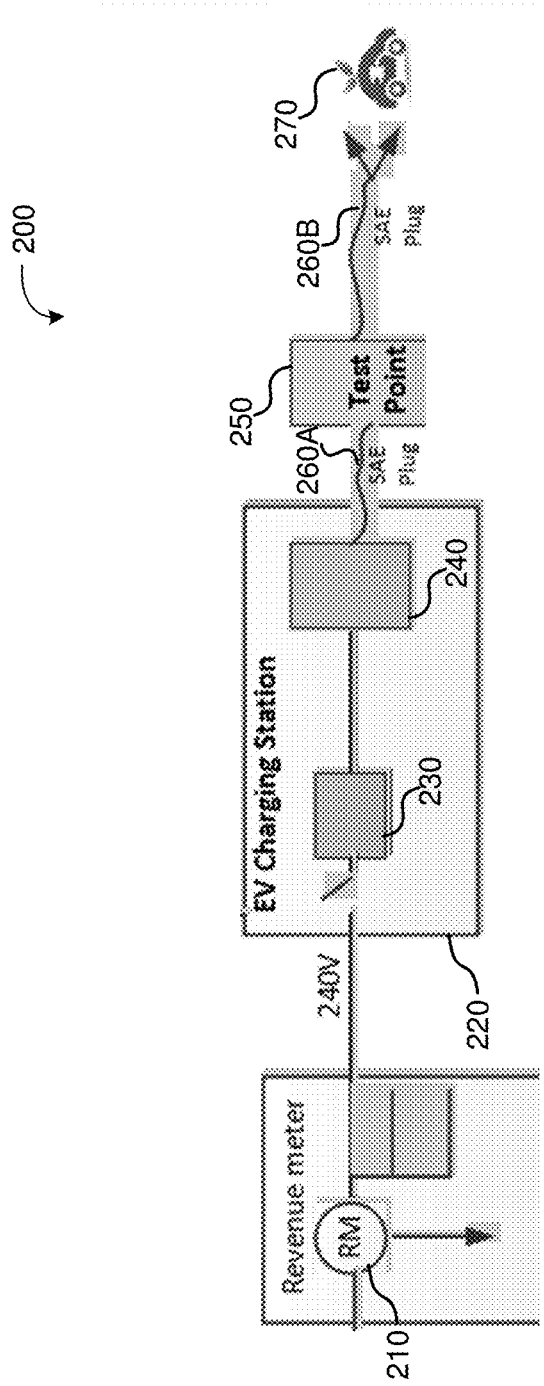
FIG. 2 illustrates a system for verifying meter accuracy of an electric vehicle charging station according to one particular embodiment.

FIG. 2 illustrates a system 200 for verifying meter accuracy of an electric vehicle charging station 220 according to one particular embodiment. Here, the system 200 includes a target electric vehicle charging station 220 that is connected to a meter test device 250.

Specifically, the electric vehicle charging station 220 may include a submeter 230 that monitors the electrical consumption during each charge session when an electric vehicle 270 is plugged and connected to the electric vehicle charging station 220. To properly and safely ensure that electrical current is transferred from the electric vehicle charging station 220 to the electric vehicle 270 or the meter test device 250, the electric vehicle charging station may include an electric vehicle supply equipment 240. The electric vehicle supply equipment may include the necessary equipment to deliver energy from the electric vehicle charging station 220 to the electric vehicle 270 or the meter test device 250. Such equipment may include grounding conductors, electric vehicle connectors, attachment plugs, power outlets, wiring to attach to the electric vehicle, and the like.

Once the meter test device 250 is properly connected to an electric vehicle 260, this allows the meter test device 250 to measure the current that runs from the electric vehicle charging station 220 to the electronic vehicle 260. Because the meter test device 250 is connected to both the electric vehicle charging station 220 and the electric vehicle 270, the meter test device 250 is able to locally capture and independently measure the amount of current being charged or discharged. By way of example, the meter test device 250 may be connected to the electric vehicle charging station via a first SAE plug 260A and also simultaneously connected to an electric vehicle via a second SAE plug 260B.

In some instances, the real time data and measurement exchange between the meter test device 250 and the electric vehicle charging station 220 may also be obtained via serial or Ethernet (IP) based communications. By way of example, such communications may be done with the use of standards, such as Modbus or DNP, communications protocols, or vendor specific schemes such as Canbus, profibus, and the like. The communication medium may be hardwired or wireless, such as WiFi, Bluetooth, radio, or WiMax.

In some embodiments, the meter test device 250 may monitor the amount of current being charged or discharged based on a select predetermined time frame as selected by the user. This time frame duration may be of any length. By way of example only, the pre-determined time frame may be anywhere from 30 seconds to 600 seconds. In other embodiments, the user may select the pre-determined duration that is adjustable in 1 second increments. After the predetermined time frame has passed, either the meter test device 250 may stop monitoring the amount of current being charged or discharged from the electric vehicle charging station 220, or the electric vehicle charging station 220 may simply stop its charge session.

In other instances, the duration in which the meter test device 250 may monitor the amount of current being charged or discharged may be determined upon a set energy amount predetermined by the user. For example, the user may wish to only monitor the amount of current being charged or discharged from the electric vehicle charging station 220 for a select amount of energy consumption. Upon reaching the predetermined amount of energy charged or discharged, either the meter test device 250 may stop monitoring the amount of current being charged or discharged from the electric vehicle charging station 220, or the electric vehicle charging station 220 may simply stop its charge session. By way of example only, the predetermined set energy amount may range anywhere from 1 watt/hour to 30 watt/hour. In some instances, the user may select the pre-determined set energy amount that is adjustable in 1 watt/hour increments.

In other instances, the meter test device 250 may be attached to the electric vehicle station 220 but may not be attached to any electric vehicle 270. In this instance, the meter test device 250 may have the ability to request or initiate a charging session with the use of an Electric Vehicle (EV) simulator to emulate hand-shaking signals such as EV connected and EV ready to charge. Thus, in this particular instance, the meter test device 250 may still be able to verify the accuracy of the submeter 230 through using load banks and without being hooked or plugged into an electric vehicle 270.

To verify the accuracy of the submeter 230 installed within the electric vehicle charging station 220, a user may have to first calibrate the meter test device 250 so that it is compatible with the electric vehicle charging station 220 to ensure that the best results may be measured. To calibrate the meter test device 250, the user may input specific electric vehicle charging station information into the meter test device 250 so that the meter test device 250 is properly configured to operate with the distinct specifications of the electric vehicle charging station 220. This allows for the meter test device 250 to obtain the best and most accurate results.

Once measurements are collected from the meter test device 250, those data points may be compared to those measurements independently obtained by the submeter 230 installed within the electric vehicle charging station 220. To ensure that the submeter 230 is indeed accurate, the measurements from both the submeter 230 and the meter test device 250 should have less than a 0.5% error difference. If there is a greater than 0.5% error, then there is a need to recalibrate the electric vehicle charging station 220 because it is no longer measuring accurate information. Because the meter test device 250 is considered to be the standard reference point due to its assumed accurate measurements, the electric vehicle charging station 220 may be re-calibrated to the meter test device 250. Additionally, any billing generated from the electric vehicle charging station 220 considered to be measuring inaccurate information may be terminated until the electric vehicle charging station 220 begins the produce accurate information again.

In some embodiments, the measurements of the submeter 230 and to the meter test device 250 may be logged. Data from both measurements may be stored onto a computing device that is connected both to the electric vehicle charging station 220 and the meter test device 250. In certain embodiments, an alert may be generated so that when the measurements from the submeter 230 and the meter test device 250 reaches a certain error percentage, a client or vendor of the charging station is notified in real time. In other instances, a report may be created based on all of the logged measurements. Both the alerts and the report may be customized to reflect the specific requirements of the client or vendor.

Additionally, the system 200 may further include a separate revenue meter 210 connected to the electric vehicle charging station 220. The revenue meter 210 may also locally gather the output energy of the electric vehicle charging station. Measurements from the revenue meter may be captured by counting a pulse series corresponding to 1 watt-hour per pulse. Infrared interface cable and optical converter may be used to capture the pulse and connect to the meter test device 250 if needed.

Figure 3:
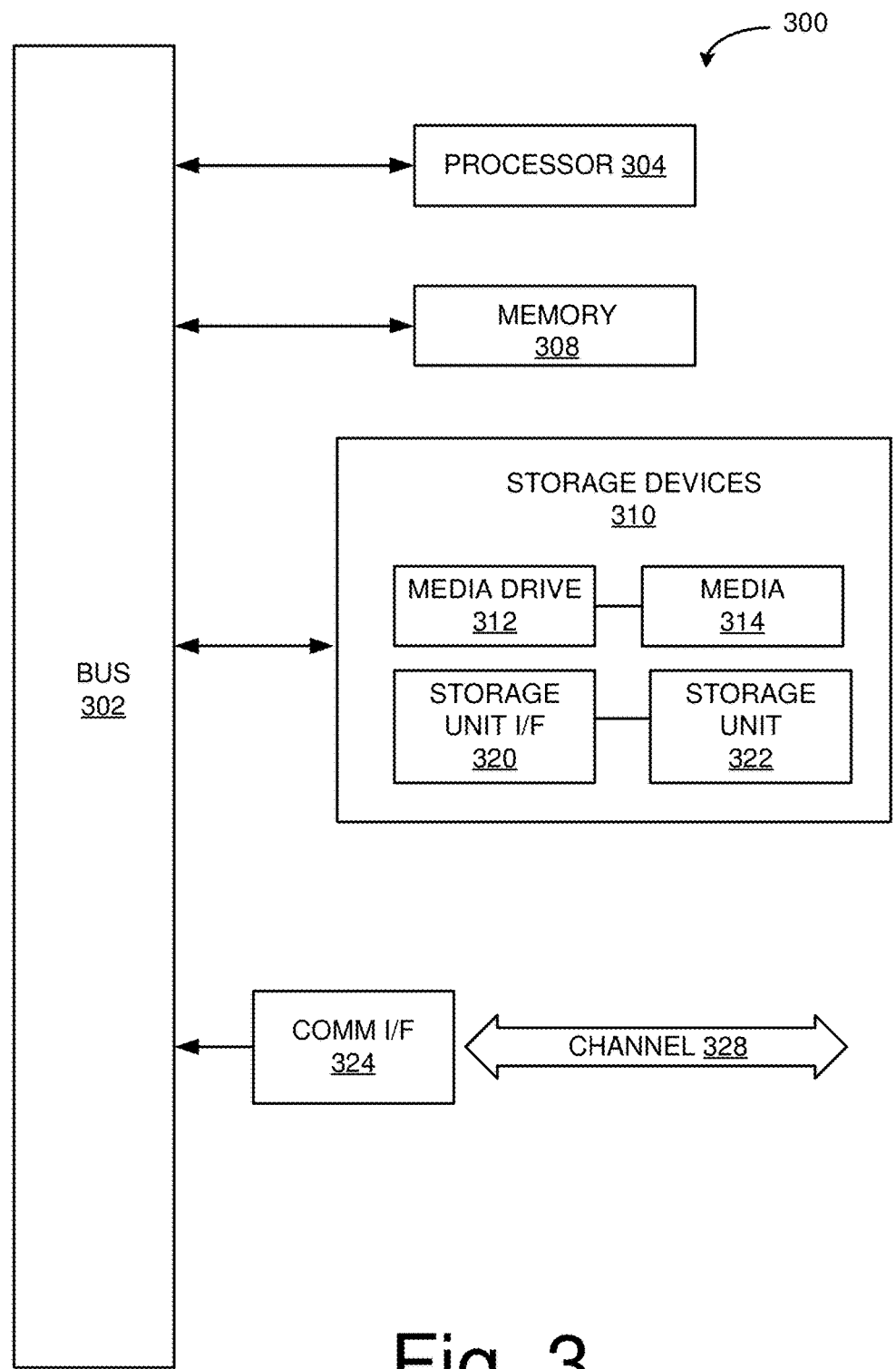
FIG. 3 is a diagram depicting an example computing module used to implement features according to certain embodiments of the provided disclosure.

FIG. 3 illustrates example computing module 300, which may in some instances include a processor/controller resident on a computer system. Computing module 300 may be used to implement various features and/or functionality of embodiments of the systems and methods disclosed herein. With regard to the above-described embodiments, one of skill in the art will appreciate additional variations and details regarding the functionality of the embodiments, as set forth herein in the context of systems and method described with reference to FIGS. 1 through 2. In this connection, it will also be appreciated by one of skill in the art that features and aspects of the various embodiments (e.g., systems) described herein may be implemented with respected to other embodiments (e.g., methods) described herein without departing from the spirit of the disclosure.

As used herein, the term module may describe a given unit of functionality that may be performed in accordance with one or more embodiments of the present application. As used herein, a module may be implemented utilizing any form of hardware, software, or a combination thereof. For example, one or more processors, automation controllers, programmable logic controllers, ASICs, PLAs, PALs, CPLDs, FPGAs, logical components, software routines or other mechanisms may be implemented to make up a module. In implementation, the various modules described herein may be implemented as discrete modules or the functions and features described may be shared in part or in total among one or more modules. In other words, as would be apparent to one of ordinary skill in the art after reading this description, the various features and functionality described herein may be implemented in any given application and may be implemented in one or more separate or shared modules in various combinations and permutations. Even though various features or elements of functionality may be individually described or claimed as separate modules, one of ordinary skill in the art will understand that these features and functionality may be shared among one or more common software and hardware elements, and such description shall not require or imply that separate hardware or software components are used to implement such features or functionality.

Where components or modules of the application are implemented in whole or in part using software, in one embodiment, these software elements may be implemented to operate with a computing or processing module capable of carrying out the functionality described with respect thereto. One such example computing module is shown in FIG. 3. Various embodiments are described in terms of example computing module 300. After reading this description, it will become apparent to a person skilled in the relevant art how to implement the application using other computing modules or architectures.

Referring to FIG. 3, computing module 300 may represent, for example, computing or processing capabilities found within mainframes, supercomputers, workstations or servers; desktop, laptop, notebook, or tablet computers; hand-held computing devices (tablets, PDA's, smartphones, cell phones, palmtops, etc.); or the like, depending on the application and/or environment for which computing module 300 is specifically purposed.

Computing module 300 may include, for example, one or more processors, controllers, control modules, or other processing devices, such as a processor 304. Processor 304 may be implemented using a special-purpose processing engine such as, for example, a microprocessor, controller, or other control logic. In the illustrated example, processor 304 is connected to bus 302, although any communication medium may be used to facilitate interaction with other components of computing module 300 or to communicate externally.

Computing module 300 may also include one or more memory modules, simply referred to herein as main memory 308. For example, random access memory (RAM) or other dynamic memory may be used for storing information and instructions to be executed by processor 304. Main memory 308 may also be used for storing temporary variables or other intermediate information during execution of instructions to be executed by processor 304. Computing module 300 may likewise include a read only memory (ROM) or other static storage device coupled to bus 302 for storing static information and instructions for processor 304.

Computing module 300 may also include one or more various forms of information storage devices 310, which may include, for example, media drive 312 and storage unit interface 320. Media drive 312 may include a drive or other mechanism to support fixed or removable storage media 314. For example, a hard disk drive, a floppy disk drive, a magnetic tape drive, an optical disk drive, a CD or DVD drive (R or RW), or other removable or fixed media drive may be provided. Accordingly, removable storage media 314 may include, for example, a hard disk, a floppy disk, magnetic tape, cartridge, optical disk, a CD or DVD, or other fixed or removable medium that is read by, written to or accessed by media drive 312. As these examples illustrate, removable storage media 314 may include a computer usable storage medium having stored therein computer software or data.

In alternative embodiments, information storage devices 310 may include other similar instrumentalities for allowing computer programs or other instructions or data to be loaded into computing module 300. Such instrumentalities may include, for example, fixed or removable storage unit 322 and storage unit interface 320. Examples of such removable storage units 322 and storage unit interfaces 320 may include a program cartridge and cartridge interface, a removable memory (for example, a flash memory or other removable memory module) and memory slot, a PCMCIA slot and card, and other fixed or removable storage units 322 and storage unit interfaces 320 that allow software and data to be transferred from removable storage unit 322 to computing module 300.

Computing module 300 may also include a communications interface 324. Communications interface 324 may be used to allow software and data to be transferred between computing module 300 and external devices. Examples of communications interface 324 include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 324 may typically be carried on signals, which may be electronic, electromagnetic (which includes optical) or other signals capable of being exchanged by a given communications interface 324. These signals may be provided to communications interface 324 via channel 328. Channel 328 may carry signals and may be implemented using a wired or wireless communication medium. Some non-limiting examples of channel 328 include a phone line, a cellular link, an RF link, an optical link, a network interface, a local or wide area network, and other wired or wireless communications channels.

In this document, the terms "computer program medium" and "computer usable medium" are used to generally refer to transitory or non-transitory media such as, for example, main memory 308, storage unit interface 320, removable storage media 314, and channel 328. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions may enable the computing module 300 or a processor to perform features or functions of the present application as discussed herein.

Various embodiments have been described with reference to specific example features thereof. It will, however, be evident that various modifications and changes may be made thereto without departing from the broader spirit and scope of the various embodiments as set forth in the appended claims. The specification and figures are, accordingly, to be regarded in an illustrative rather than a restrictive sense.

Although described above in terms of various example embodiments and implementations, it should be understood that the various features, aspects and functionality described in one or more of the individual embodiments are not limited in their applicability to the particular embodiment with which they are described, but instead may be applied, alone or in various combinations, to one or more of the other embodiments of the present application, whether or not such embodiments are described and whether or not such features are presented as being a part of a described embodiment. Thus, the breadth and scope of the present application should not be limited by any of the above-described example embodiments.

Terms and phrases used in the present application, and variations thereof, unless otherwise expressly stated, should be construed as open ended as opposed to limiting. As examples of the foregoing: the term "including" should be read as meaning "including, without limitation" or the like; the term "example" is used to provide illustrative instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, may be combined in a single package or separately maintained and may further be distributed in multiple groupings or packages or across multiple locations.

Additionally, the various embodiments set forth herein are described in terms of example block diagrams, flow charts, and other illustrations. As will become apparent to one of ordinary skill in the art after reading this document, the illustrated embodiments and their various alternatives may be implemented without confinement to the illustrated examples. For example, block diagrams and their accompanying description should not be construed as mandating a particular architecture or configuration.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A system for verifying accuracy of an electric meter, comprising:
an electric vehicle charging station comprising a submeter that measures an amount of energy discharged from the electric vehicle charging station;
a meter test device connected to the electric vehicle charging station to determine accuracy of the submeter by independently measuring the amount of energy discharged from the electric vehicle charging station; and an electric vehicle plugged into the electric vehicle charging station, wherein the meter test device is programmed to perform a power up test, full-load charge test, light-load charge test, an interruption test, and a harmonic test.

2. The system of claim 1, wherein the meter test device comprises an input socket to connect the electric vehicle charging station to the meter test device.

3. The system of claim 2, wherein the meter test device comprises an output socket to connect the meter test device to the electric vehicle.

4. The system of claim 1, wherein the meter test device logs an amount of energy generated from the electric vehicle charging station.

5. The system of claim 1, wherein the meter test device comprises a database of information of electric vehicle charging station models of various vendors, where the information comprises specification and parameter details needed to calibrate the meter test device to the electric vehicle charging station.

6. The system of claim 5, wherein the meter test device comprises of a graphic user interface to manually input or view electric vehicle charging station information.

7. The system of claim 6, wherein meter test device automatically configures itself to setting requirements of the electric vehicle charging station upon selecting type or model of the electric vehicle charging station.

8. The system of claim 7, wherein the graphic user interface displays different tests to be performed with the electric vehicle charging station.

9. A method for verifying accuracy of an electric meter in real time, comprising:

connecting a meter test device to an electric vehicle charging station;

connecting the meter test device to an electric vehicle;

obtaining a first measurement from an electric meter installed within the electric vehicle charging station to determine an amount of energy locally discharged from the electric vehicle charging station;

obtaining a second measurement with the meter test device to independently determine the amount of energy locally discharged from the electric vehicle charging station; and comparing measurements obtained from the electric meter test device and the electric meter to determine accuracy of the electric meter, wherein the meter test device is programmed to perform a power up test, full-load charge test, light-load charge test, an interruption test, and a harmonic test.

10. The method of claim 9, wherein obtaining the second measurement lasts is done for a pre-determined duration adjustable in 1 second increments.

11. The method of claim 9, wherein obtaining the second measurement is determined for a set energy amount adjustable in 1 watt/hour increments.

12. The method of claim 9, further comprising characterizing the electric meter as accurate when the difference between the first measurement and the second measurement is less than 0.5%.

13. The method of claim 9, further comprising logging measurements from the meter test device and measurements from the electric meter.

14. The method of claim 13, further comprising generating a bill report based on the first measurement from the electric meter when the electric meter is deemed accurate.

15. The method of claim 9, wherein the electric meter is a submeter.

16. The method of claim 9, further comprising calibrating the meter test device to specifications and parameters of the electric vehicle charging station to ensure proper connection between the meter test device and electric vehicle charging station.

17. The method of claim 16, wherein the meter test device comprises a database of information providing specification and parameter details for each type of electric vehicle charging station provided by various vendors.

18. The method of claim 9, wherein the first measurement and the second measurement are obtained in real time wirelessly by WiFi, Bluetooth, radio, or WiMax communication with the electric vehicle charging station.

* * * * *